(12) United States Patent
Li et al.

(10) Patent No.: US 8,294,528 B2
(45) Date of Patent: Oct. 23, 2012

(54) WIDEBAND MULTI-MODE VCO

(75) Inventors: Guansheng Li, San Diego, CA (US); Li Liu, San Diego, CA (US); Yiwu Tang, San Diego, CA (US)

(73) Assignee: Qualcomm Incorporated, San Diego, CA (US)

( * ) Notice: Subject to any disclaimer, the term of this patent is extended or adjusted under 35 U.S.C. 154(b) by 36 days.

(21) Appl. No.: 12/979,659

(22) Filed: Dec. 28, 2010

(65) Prior Publication Data

US 2012/0161890 A1 Jun. 28, 2012

(51) Int. Cl.
 H03B 5/12 (2006.01)
 H03K 3/30 (2006.01)
 H03C 3/22 (2006.01)

(52) U.S. Cl. .............. 331/117 FE; 331/36 C; 331/36 L; 331/76; 331/112; 331/177 V

(58) Field of Classification Search ............ 331/34, 331/36 C, 36 L, 76, 112, 117 FE, 117 R, 331/167, 177 V, 181
See application file for complete search history.

(56) References Cited

U.S. PATENT DOCUMENTS

| 3,939,429 A * | 2/1976 | Lohn et al. ............ 455/255 |
| 2008/0007366 A1 | 1/2008 | Bevilacqua et al. | |
| 2010/0248647 A1 * | 9/2010 | Wachi ............... 455/73 |
| 2010/0271086 A1 * | 10/2010 | Bao et al. ............. 327/144 |
| 2011/0018644 A1 | 1/2011 | Yun et al. | |

FOREIGN PATENT DOCUMENTS

WO WO2009054760 A1 4/2009

OTHER PUBLICATIONS

Hsieh T., et al., "A Reconfigurable Oscillator Topology for Dual-Band Operation", VLSI Design, 2005. 18th International Conference on Kolkata, India Jan. 3-7, 2005, Piscataway, NJ, USA, IEEE, Jan. 3, 2005, pp. 870-873, XP010769953, DOI: 10.1109/ICVD.2005.31, ISBN: 978-0-7695-2264-7 the whole document.
International Search Report and Written Opinion—PCT/US2011/067620—ISA/EPO—Apr. 25, 2012.
Safarian et al: "Wideband Multi-Mode CMOS VCO Design Using Coupled Inductors", IEEE Transactions on Circuits and Systems-I: Regular Papers, Aug. 2009, pp. 1830-1843, vol. 56, No. 8.

(Continued)

Primary Examiner — Levi Gannon
(74) Attorney, Agent, or Firm — Eric Ho

(57) ABSTRACT

A VCO includes a transformer-based resonator that has a first LC tank and a second LC tank. The resonator has an even resonant mode and an odd resonant mode. The VCO further includes an active transconductance network that is coupled to a two-terminal port of the first tank and is also coupled to a two-terminal port of the second tank. A first terminal of the port of the first tank is capacitively coupled to a first terminal of the port of the second tank. A second terminal of the port of the first tank is capacitively coupled to a second terminal of the port of the second tank. The active transconductance network causes the resonator to resonate in a selectable one of the even and odd resonant modes depending on a digital control signal. The VCO is fine tuned by changing the capacitances of capacitors of the tanks.

28 Claims, 9 Drawing Sheets

TRANSFORMER-BASED
RESONATOR PORTION

OTHER PUBLICATIONS

Kral et al.: "RF-CMOS Oscillators With Switched Tuning", IEEE 1998 Custom Integrated Circuits Conference, pp. 555-558, University of California, Los Angeles, California, USA.

Yim et al.: "Switched Resonators and Their Applications in a Dual-Band Monolithic CMOS LC-Tuned VCO", Jan. 2006, pp. 74-81, IEEE Transactions on Microwave Theory and Techniques, vol. 54, No. 1.

Kim et al.: "A Wide=Band CMOS LC VCO With Linearized Coarse Tuning Characteristics", May 2008, pp. 399-403, IEEE Transactions on Circuits and Systems-II, Express Briefs, vol. 55, No. 5.

Demirkan et al.: "11.8GHz CMOS VCO With 62% Tuning Range Using Switched Coupled Inductors", 2007 IEEE Radio Frequency Integrated Circuits Symposium, pp. 401-404, Solid-State Circuits Research Laboratory, University of California, Davis, California, USA.

Geynet et al.: "Fully-Integrated Multi-Standard VCOs With Switched LC Tank and Power Controlled by Body Voltage in 130nm CMOS/SOI", Valbonne, France, 2006.

Kossel et al.: "LC PLL With 1.2-Octave Locking Range Based on Mutual-Inductance Switching in 45-nm SOI CMOS", Feb. 2009, pp. 436-449, IEEE Journal of Solid-State Circuits, vol. 44, No. 2.

Steinkamp et al.: "A Multi-Mode Wide-Bank 130nm CMOS VCO for WLAN and GSM/UMTS", Nov. 30-Dec. 2, 2005, pp. 105-108, IEEE International Workshop on Radio-Frequency Integration Technology, Singapore.

Bevilacqua et al.: "Transformer-Based Dual-Mode Voltage-Controlled Oscillators", Apr. 2007, pp. 293-297, IEEE Transactions on Circuits and Systems-II: Express Briefs, vol. 54, No. 4.

Borremans et al.: "A Single-Inductor Dual-Band VCO in a 0.06mm2 5.6GHz Multi-Band Front-End in 90 nm Digital CMOS", Feb. 5, 2008, IEEE International Solid-State Circuits Conference, Universiteit Brussel, Brussels, Belgium.

Lu et al.: "A Wide Tuning-Range CMOS VCO With a Differential Tunable Active Inductor", Sep. 2006, pp. 3462-3468, IEEE Transactions on Microwave Theory and Techniques, vol. 54, No. 9.

Straayer et al.: "A Low-Noise Transformer-Based 1.7 GHz CMOS VCO", Feb. 2002, ISSCC 2002, Session 17, Advanced RF Techniques, 17.1, EECS Department, University of Michigan, Ann Arbor, Michigan, USA, Department of Electronica (SIC), University of Barcelona, Spain.

* cited by examiner

ACTIVE TRANSCONDUCTANCE NETWORK
PORTION IN MORE DETAIL

IMPEDANCE LOOKING INTO FIRST PORT

IMPEDANCE LOOKING INTO FIRST PORT

TRANSCONDUCTANCE NETWORK MODELED AS A
TWO-PORT NETWORK

CONDITIONS FOR EVEN MODE OSCILLATION

77 → $|R_{p,e} \cdot G_{even}| > 1$ and $G_{even} < 0$

78 → $|R_{p,o} \cdot G_{odd}| < 1$ or $G_{odd} > 0$

CONDITIONS FOR ODD MODE OSCILLATION

79 → $|R_{p,o} \cdot G_{odd}| > 1$ and $G_{odd} < 0$

80 → $|R_{p,e} \cdot G_{even}| < 1$ or $G_{even} > 0$

| C | Total (0.84-2.76pF) = 8-bit Coarse Tuning (0.53pF-2.37pF) + Varactor (0.109-0.186pF) + Parasitic Cap (0.2pF) |
|---|---|
| L | 1 nH |
| Rs | 1 Ohms |
| Cc | 0.285 pF |
| M | -0.2 nH |
| Gm | 2 mS |
| Gmc | 3 mS |
| Rp,e | 220 - 430 Ohms |
| Rp,o | 320 - 540 Ohms |
| Geven | -5 mS (even mode) 1 mS (odd mode) |
| Godd | 1 mS (even mode) -5 mS (odd mode) |
| $f_o$ | 2.6 - 4.1 GHz |
| $f_e$ | 3.4 - 5.8 GHz |
| VSUP | 0.85 Volts |
| TUNING RANGE | 2.6 GHz TO 5.8 GHz |
| Gmc TRANSISTORS | 36 um / 280 um (W/L) |
| -Gm TRANSISTORS | 24 um / 280 um (W/L) |
| Q | > 20 |
| PHASE NOISE | <-155 dBc/Hz @ 20MHz @ 3.8 GHz |
| AREA | 0.474 mm$^2$ |
| POWER | < 10 mw |

FIG. 14

WIDEBAND MULTI-MODE VCO

BACKGROUND INFORMATION

1. Technical Field

The present disclosure relates to Voltage-Controlled Oscillator (VCO) circuits and methods.

2. Background Information

Radio receivers and transmitters such as those in cellular telephone handsets typically employ local oscillators. Oftentimes such a local oscillator involves a Phase-Locked Loop (PLL) that in turn employs a Voltage Controlled Oscillator (VCO). One way to realize a VCO involves an LC resonator whose natural oscillating frequency is adjusted to tune the frequency of oscillation of the VCO. One way to accomplish this tuning is to adjust the inductance value L of the resonator. Another way is to adjust the capacitance value C of the resonator. Switches such as field effect transistor switches can be employed to switch capacitors into and out of a capacitor network to adjust the capacitance value C of the resonator. Switches can also be employed to switch inductors into and out of an inductor network. Regardless of whether the switches switch in or out inductors or capacitors, the switches can be in the path of the oscillating current that passes back and forth between the inductance and the capacitance as the resonator resonates. If the switches are realized to be large transistor devices, then their series on-resistances are generally small. This is advantageous because power loss across the switches is advantageously small. Unfortunately, providing large switches generally introduces relatively large parasitic capacitances. Large parasitic capacitances are undesirable for several reasons. One reason is that the tunability of the resonator may be reduced. If, on the other hand, the transistor switches are made to be small devices, then the parasitic capacitances are advantageously smaller. Tunability of the resonator is improved but the series resistance of the switches is larger. As the oscillating current passes through the switches in their on states, there is power loss and noise is introduced into the oscillating signal. The quality factor Q of the resonator is reduced and phase noise in the output signal of the oscillator is increased. Making an LC resonator of a VCO tunable therefore generally has undesirable impact on VCO phase noise performance and power consumption.

In addition to the difficulties described above involving providing tunability, it is increasingly the case that a local oscillator should be tunable over a wide frequency range. It may, for example, be required that the receiver and the transmitter of a cellular telephone handset be usable to communicate using a selectable one of multiple different cellular telephone standards. The same handset may be required to communicate at a first time using the GMS standard, at another time using the WCDMA standard, and at a third time using the LTE standard. Due to having to operate using these various different standards, the local oscillators of the receiver and transmitter of the cellular telephone handset must generate signals that cover all of the frequency bands used by all of the standards supported. Such a local oscillator may, for example, be required to output a local oscillator signal in a wide tuning range where the lowest frequency is less than half of the highest frequency. This wide frequency range imposes further design difficulties on VCO design due in part to the need to provide large amounts of programmability in the capacitors and/or inductors of the VCO's resonator. Rather than providing this wide tunability range using one resonator, multiple resonators can be provided where the different resonators are fabricated to resonate at different center frequencies. VCO's involving multiple resonators are, however, generally inefficient and suffer from performance drawbacks. Such drawbacks include large area due to having to provide multiple inductors and include routing and layout difficulties.

SUMMARY

A wideband multi-mode Voltage Controlled Oscillator (VCO) includes a transformer-based LC resonator that has an odd resonant mode and an even resonant mode. The transformer-based resonator includes a first inductor coupled in parallel with a first capacitor between a first node and a second node, a second inductor coupled in parallel with a second capacitor between a third node and a fourth node, a third capacitor coupled between the first node and the third node, and a fourth capacitor coupled between the second node and the fourth node. The first and second nodes together are a first two-terminal port of the resonator and the third and fourth nodes together are a second two-terminal port of the resonator. The first and second inductors are magnetically coupled together and form a transformer.

In one example, each of the first and second capacitors is a capacitor network involving varactors and a digitally programmable capacitor. A fine tune analog input signal VIN to the VCO is received via an input control conductor onto the VCO and is supplied to the varactors so that the capacitances of the varactors are made to depend on the magnitude of VIN. A COARSE_TUNE multi-bit digital control input signal to the VCO is supplied to the digitally programmable capacitor via a set of digital control conductors so that the capacitance of the digitally-programmable capacitor is made to depend on the COARSE_TUNE multi-bit digital control input signal. Setting the oscillating frequency of the VCO involves setting the resonating mode, setting the multi-bit digital value COARSE_TUNE, and setting the fine tune analog voltage VIN.

In addition to the transformer-based resonator, the wideband multi-mode VCO includes an active transconductance network that is coupled to the first node, second node, third node and fourth node. The active transconductance network causes the transformer-based resonator to resonate in its even resonant mode when a digital control signal has a first digital logic value and causes the transformer-based resonator to resonate in its odd resonant mode when the digital control signal has a second digital logic value.

In one embodiment, the active transconductance network comprises a first transconductance network, a second transconductance network, and a third transconductance network. The first transconductance network is coupled to the first and second nodes and acts as a negative resistance circuit between the first and second nodes. The second transconductance network is coupled to the third and fourth nodes and acts as a negative resistance circuit between the third and fourth nodes. The third transconductance network is coupled to the first, second, third and fourth nodes. The third transconductance network injects energy into the oscillator in such a way that the resonator oscillates in its odd resonant mode when the digital control signal has the first digital logic value and in such a way that the resonator oscillates in its even resonant mode when the digital control signal has the second digital logic value.

In one specific embodiment, the multi-mode VCO is tunable over a wide frequency range from 2.6 GHz to 5.8 GHz, and throughout this range has a quality factor Q greater than 20, and a phase noise of less than −155 dBc/Hz, and is implemented in less than 0.5 square millimeters, and consumes less than 10 mW from a 0.85 volt supply.

The foregoing is a summary and thus contains, by necessity, simplifications, generalizations and omissions of detail; consequently, those skilled in the art will appreciate that the summary is illustrative only and does not purport to be limiting in any way. Other aspects, inventive features, and advantages of the devices and/or processes described herein, as defined solely by the claims, will become apparent in the non-limiting detailed description set forth herein.

BRIEF DESCRIPTION OF THE DRAWINGS

FIG. 14 is a table that sets forth circuit parameters and characteristics for one implementation of the multi-mode VCO that satisfies the conditions of FIG. 12 and FIG. 13.

DETAILED DESCRIPTION

Figure 1:
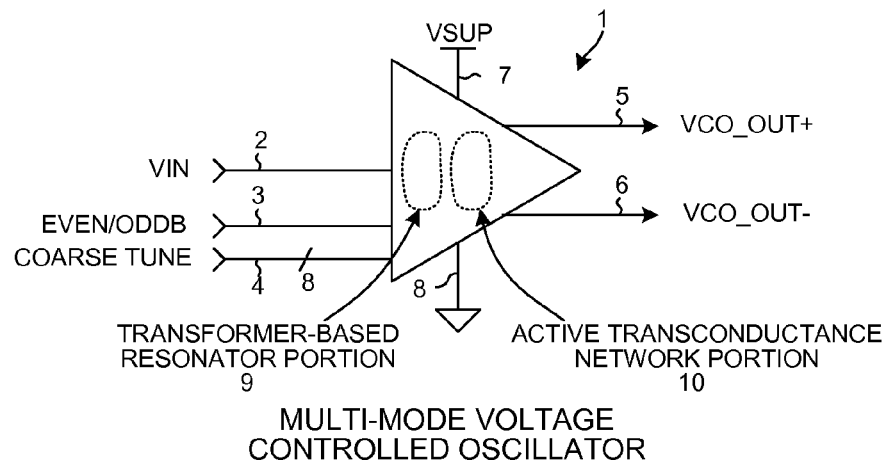
FIG. 1 is a diagram of a wideband multi-mode Voltage Controlled Oscillator (VCO) in accordance with one novel aspect.

FIG. 1 is a diagram of a wideband multi-mode Voltage Controlled Oscillator
(VCO) 1 in accordance with one novel aspect. VCO 1 has an input lead for receiving a fine tune analog signal VIN, a control signal input lead and conductor 3 for receiving a single bit digital signal EVEN/ODDB, eight input leads and conductors 4 for receiving an multi-bit digital control value COARSE_TUNE, a first differential output lead 5 for outputting a signal VCO_OUT+, a second differential output lead 6 for outputting a signal VCO_OUT−, a supply voltage input lead and conductor 7, and a ground lead and conductor 8. VCO 1 includes a transformer-based resonator portion 9 and an active transconductance network portion 10. VCO 1 is a "multi-mode" VCO in the sense that its resonator can oscillate in an odd resonant mode, or in an even resonant mode, and the overall oscillator can be switched so that it oscillates in a selectable one of the two modes.

Figure 2:
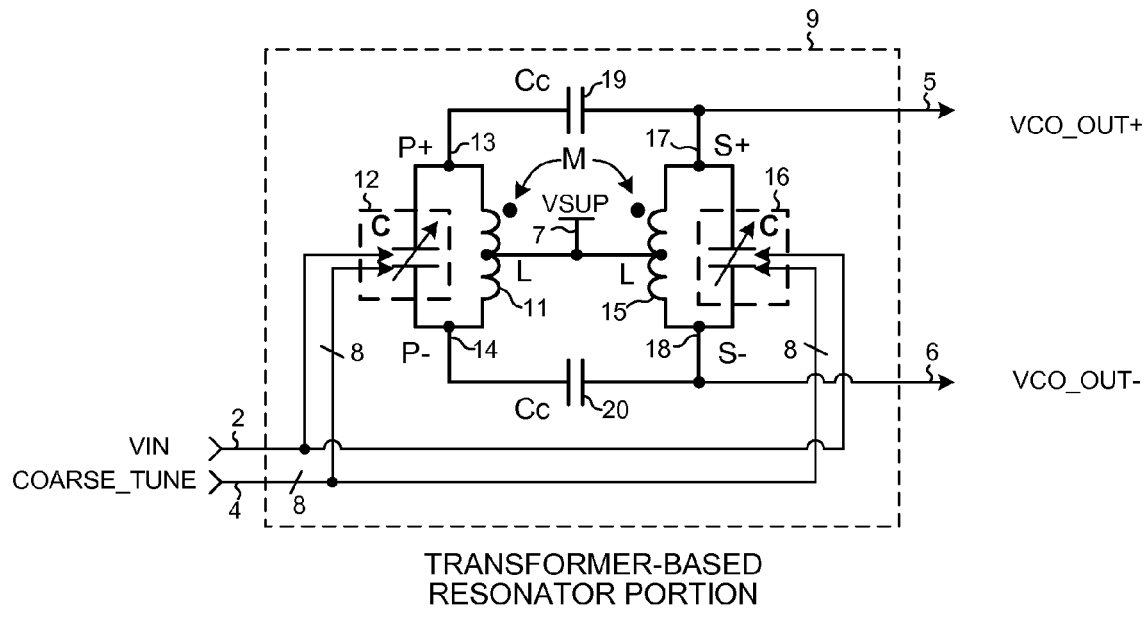
FIG. 2 is a more detailed diagram of the transformer-based resonator portion 9 of the VCO of FIG. 1.

FIG. 2 is a more detailed diagram of the transformer-based resonator portion 9. Transformer-based resonator portion 9 includes a first resonant LC tank and a second resonant LC tank. The first resonant LC tank includes a first inductor 11 and a first capacitor 12 coupled between a first node P+ 13 and a second node P− 14. First node P+ and second node P− together are a two-terminal port of the first resonant LC tank. The second resonant LC tank includes a second inductor 15 and a second capacitor 16 coupled between a third node S+ 17 and a fourth node S− 18. Third node S+ and fourth node S− together are a two-terminal port of the second resonant LC tank. The inductors 11 and 15 are magnetically coupled and form a transformer. Their mutual inductance is denoted by the "M" in the diagram. In one specific embodiment, the mutual inductance M is given by the relation k=M/sqrt(L1L2), where L1 is the inductance of inductor 11, where L2 is the inductance of inductor 15, and where |k|>0.02.

In addition, the transformer-based resonator portion 9 includes a third capacitor Cc 19 coupled between the first node P+ and the third node S+, and also includes a fourth capacitor Cc 20 coupled between the second node P− and the fourth node S−. In one specific embodiment, the third and fourth capacitors 19 and 20 are MOS capacitors or Metal-Insulator-Metal (MIM) capacitor structures of 0.285 pF and are not just incidental parasitic capacitances; the capacitance of the Cc capacitors 19 and 20 in the specific embodiment is at least five percent of the capacitance of the first and second capacitors C 12 and 16. The inductors 11 and 15 have center taps that are coupled to the supply voltage conductor 7 as illustrated. Arrow 5 represents output lead 5 of FIG. 1, and arrow 6 represents output lead 6 of FIG. 1. There output leads are extensions of the nodes S+ and S−, respectively. The first and second capacitors 12 and 16 are actually tunable and digitally-programmable capacitor networks. Each of these capacitors has an input conductor for receiving the fine tuning analog signal VIN and supplying VIN to a pair of varactors. Each of these capacitors also has eight input conductors for receiving the eight-bit digital control value COARSE_TUNE.

Figure 3:
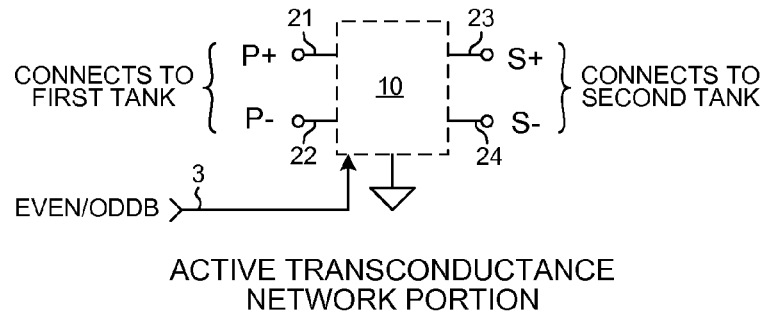
FIG. 3 is a block diagram of the active transconductance network portion 10 of the VCO of FIG. 1.

FIG. 3 is a block diagram of the active transconductance network portion 10 of FIG. 1. The active transconductance network portion 10 is coupled to first node P+ as indicated by symbolic terminal 21, is coupled to second node P− as indicated by symbolic terminal 22, is coupled to third node S+ as indicated by symbolic terminal 23, and is coupled to fourth node S− as indicated by symbolic terminal 24. Terminals 21 and 22 are considered to be a first port of a two port network, and are connected to the first LC tank of the resonator. Terminals 23 and 24 are considered to be a second port of the two port network, and are connected to the second LC tank of the resonator. P+ terminal 21 of FIG. 3 and node P+ 13 of FIG. 2 are actually the same node; P-terminal 22 of FIG. 3 and node P− 14 of FIG. 2 are actually the same node; S+ terminal 23 of FIG. 3 and node S+ 17 of FIG. 2 are actually the same node; and S− terminal 24 of FIG. 3 and node S− 18 of FIG. 2 are actually the same node. The EVEN/ODDB digital input conductor and lead 4 supplies a digital control signal EVEN/ODDB to the active transconductance network portion.

Figure 4:
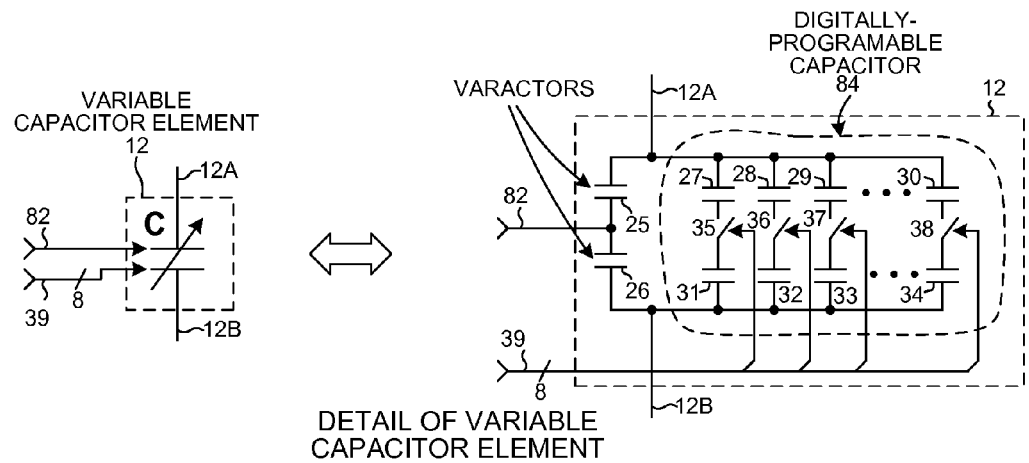
FIG. 4 is a diagram that shows the details of the capacitor 12 of the resonator portion 9 of FIG. 2.

FIG. 4 is a diagram that shows the details of capacitor 12. Capacitors 12 and 16 are of identical construction. Capacitor 12 is a variable capacitor element and includes two varactors 25 and 26, and eight pairs of capacitors 27-34. Each pair of capacitors can be switched into, or out of, the overall capacitor circuit by turning on, or off, an associated transistor switch. The eight switches are denoted with reference numerals 35-38. Switches 35-38 and capacitors 27-34 form a digitally programmable capacitor 84. Leads 12A and 12B are the two leads of capacitor 12. Lead 82 is the fine tuning input lead extending to the varactors 25 and 26. Leads 39 are eight digital input signal conductors that extend to the switches 35-38.

Figure 5:
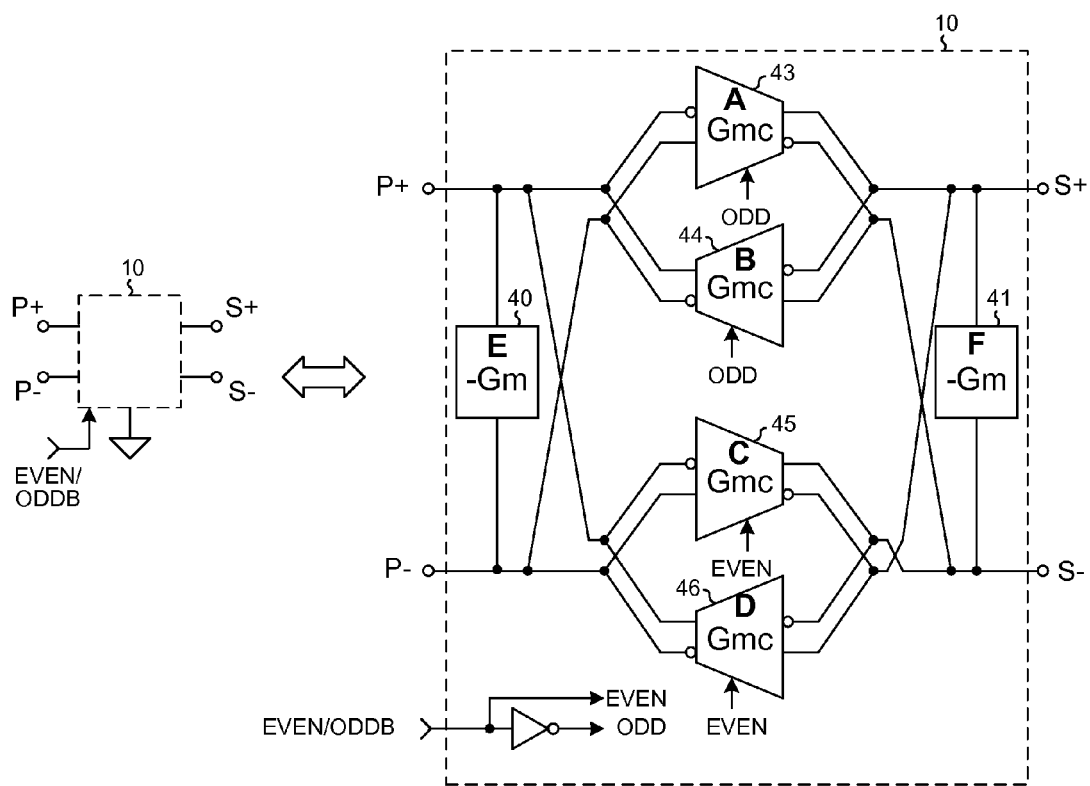
FIG. 5 is a diagram that shows circuit detail that is represented by the two-port symbol of the active transconductance network portion 10 of FIG. 3.
Figure 6:
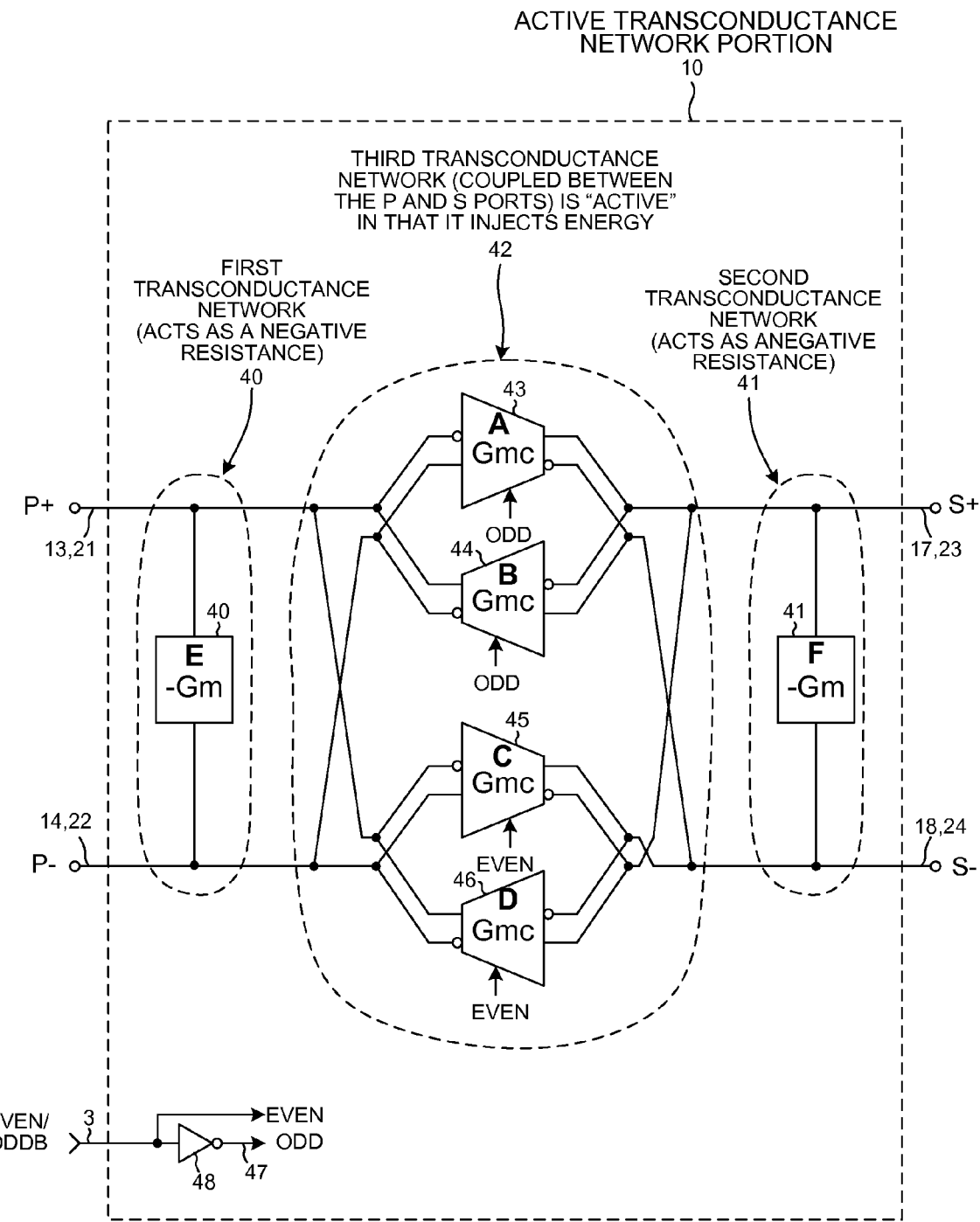
FIG. 6 is a larger version of FIG. 5.

FIG. 5 is a diagram that shows circuit detail that is represented by the two-port symbol of the active transconductance network portion 10 of FIG. 3. FIG. 6 is a larger diagram of the circuit detail. As indicated in FIG. 6, the active transconductance network portion 10 includes a first transconductance network E 40 coupled between first node P+ and second node P−. This first transconductance network E is denoted by −Gm to indicate that it acts like a negative resistance. In an ordinary resistor, as the voltage across the resistor decreases the current flow through the resistor decreases as well in accordance with V=IR. In a negative resistance, as the voltage across the resistor decreases the current flow through the resistor increases. The −Gm notation indicates that the conductance of this circuit element is negative. First transconductance network E is not directly connected to third node S+ or to fourth node S−.

The active transconductance network portion 10 further includes a second transconductance network F 41 coupled between third node S+ and the fourth node S−. This −Gm circuit F 41 is of identical construction to the −Gm circuit E 40. Second transconductance network F is not directly connected to first node P+ or to second node P−.

The active transconductance network portion 10 further includes a third transconductance network 42. This third transconductance network 42 is actually an active two-port device and couples to all four nodes P+ 13, P− 14, S+ 17, and S− 18. The third transconductance network is "active" in the sense that it injects energy into the oscillating signal. The third transconductance network includes four Gmc portions denoted A 43, B 44, C 45 and D 46. Gmc portions A and B are enabled when the digital signal ODD received via conductor 47 from inverter 48 is a digital logic high, and are disabled when the signal ODD is a digital logic low. Gmc portions C and D are enabled when the digital signal EVEN received from conductor and lead 3 is a digital logic high, and are disabled when the signal EVEN is a digital logic low. As indicated in the diagram, the digital signal EVEN/ODDB and the digital signal EVEN are the same digital signal. The "B" in the signal name EVEN/ODDB indicates "bar" (that logical signal ODD is active low).

Figure 7:
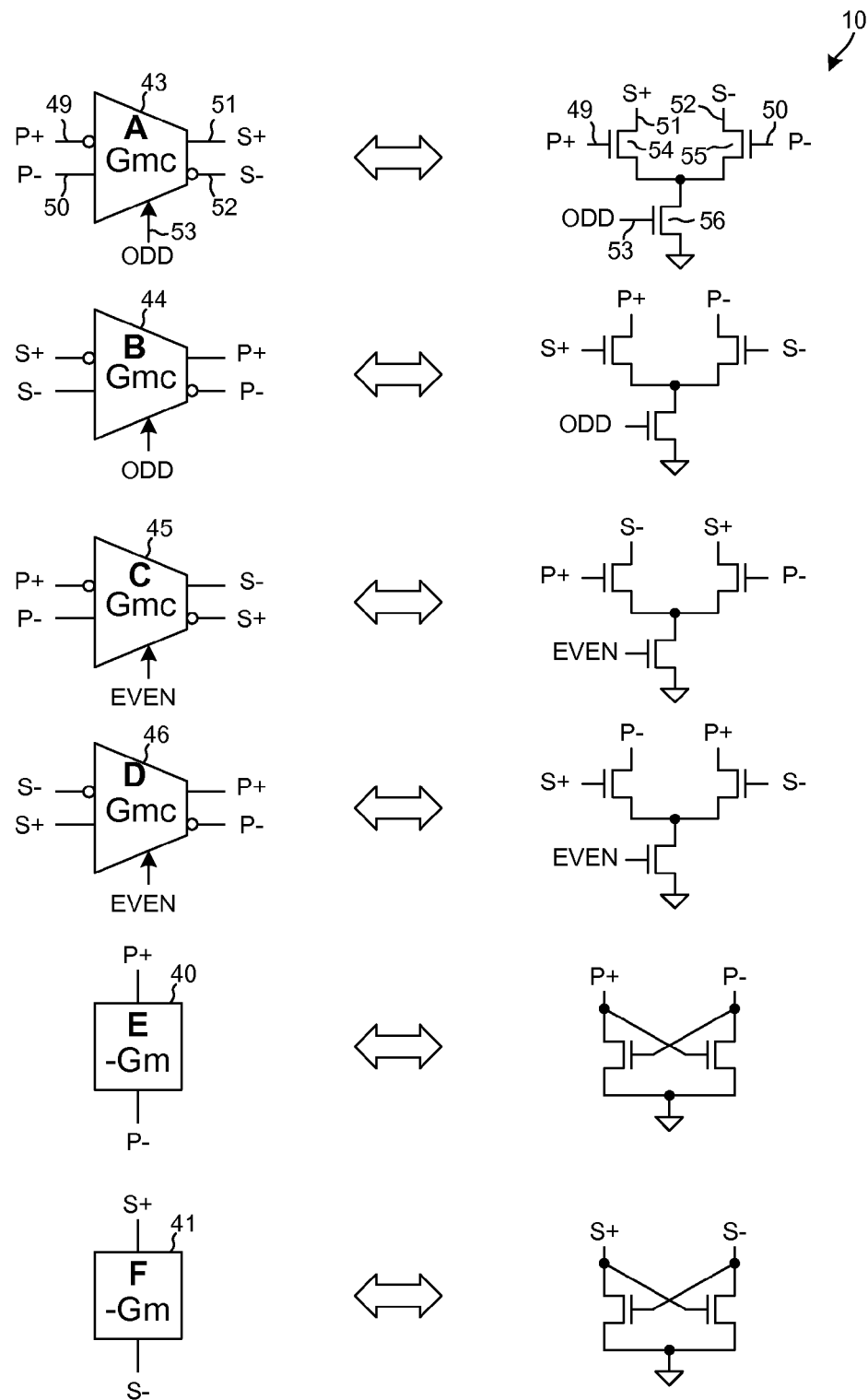
FIG. 7 is a diagram that shows an N-channel circuit implementation of the active transconductance network portion 10.

FIG. 7 is a diagram that shows how the portions A-F of FIG. 6 are realized in one specific embodiment. The left column shows block level symbols whereas the right column shows the corresponding transistor level schematics. The double headed arrow symbols in the center column of the diagram indicate that the block level symbols in the left column represent and the transistor level circuits in the right column. For example, Gmc portion A in the upper left of FIG. 7 has leads 49-53, and these leads correspond to leads 49-53 in the transistor level circuit to the right. The circuit involves three N-channel transistors 54-56. The drain of transistor 54 is coupled to third node S+. The gate of transistor 54 is coupled to first node P+. The drain of transistor 55 is coupled to fourth node S−. The gate of transistor 55 is coupled to second node P−. The sources of transistors 54 and 55 are coupled together and to the drain of enable transistor 56. The gate of enable transistor 56 is coupled to receive the ODD digital control signal. The source of enable transistor 56 is grounded. The correspondence between the labeled leads of the other block level symbols and their corresponding transistor level schematics is made in the same way as the correspondence explained above between the block level symbol of Gmc A and its transistor level schematic in the upper right of FIG. 7.

Figure 8:
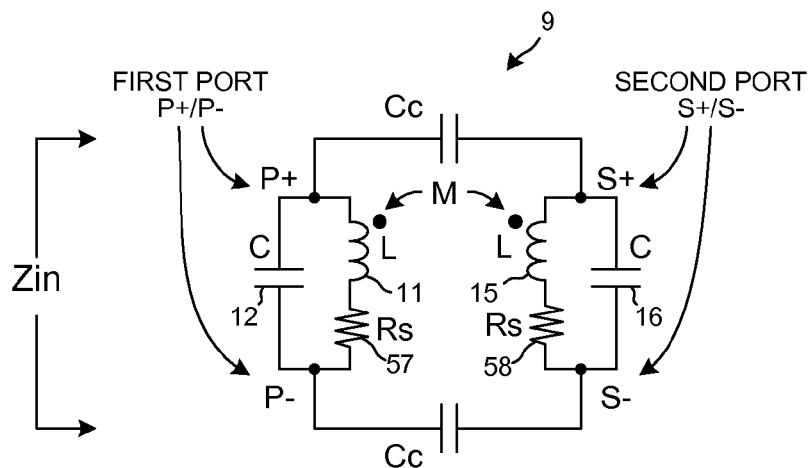
FIG. 8 is a diagram useful in understanding how a transformer-based LC resonator has both an even resonant mode and an odd resonant mode.

FIG. 8 is a diagram useful in understanding how a transformer-based LC resonator has both an even resonant mode and an odd resonant mode. The first and second inductors of the transformer are not ideal circuit components, but rather each of these inductors is a real circuit element that has an amount of series resistance Rs. Resistor Rs 57 denotes the series resistance of inductor 11. Resistor Rs 58 denotes the series resistance of inductor 15. The variability of the capacitors C 12 and 16 is ignored and is assumed to be a constant. The impedance Zin looking into the first port P+/P− of the resonator is considered.

Figure 9:
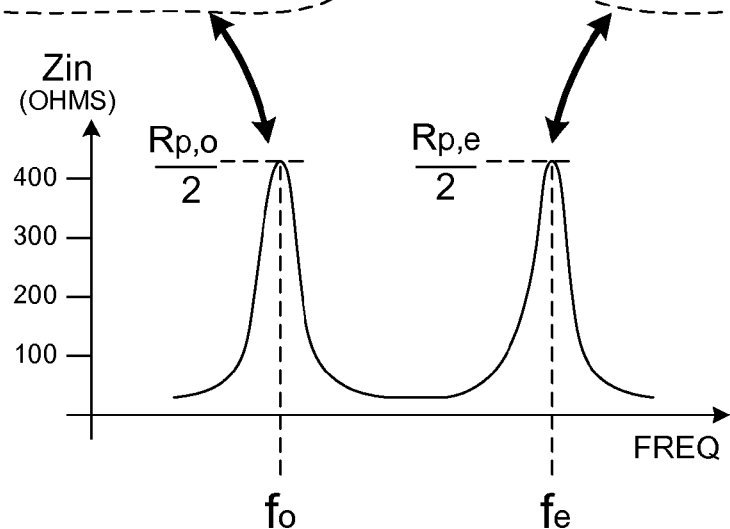
FIG. 9 is a diagram that shows how the observed input impedance Zin of the resonator of FIG. 8 changes as a function of frequency.

FIG. 9 is a diagram that shows how the observed input impedance Zin changes as a function of frequency. The input impedance Zin has a first peak at a first frequency fo referred to here as the odd resonant mode resonating frequency. Equations for the input impedance Rp,o of the resonator at this fo frequency and for the fo odd mode resonating frequency are set forth in FIG. 9. In addition to this first peak, the input impedance Zin also has a second frequency fe referred to here as the even resonant mode resonating frequency. Equations for the input impedance Rp,e of the resonator at this fe frequency and for the fe even mode resonating frequency are set forth in FIG. 9.

Figure 10:
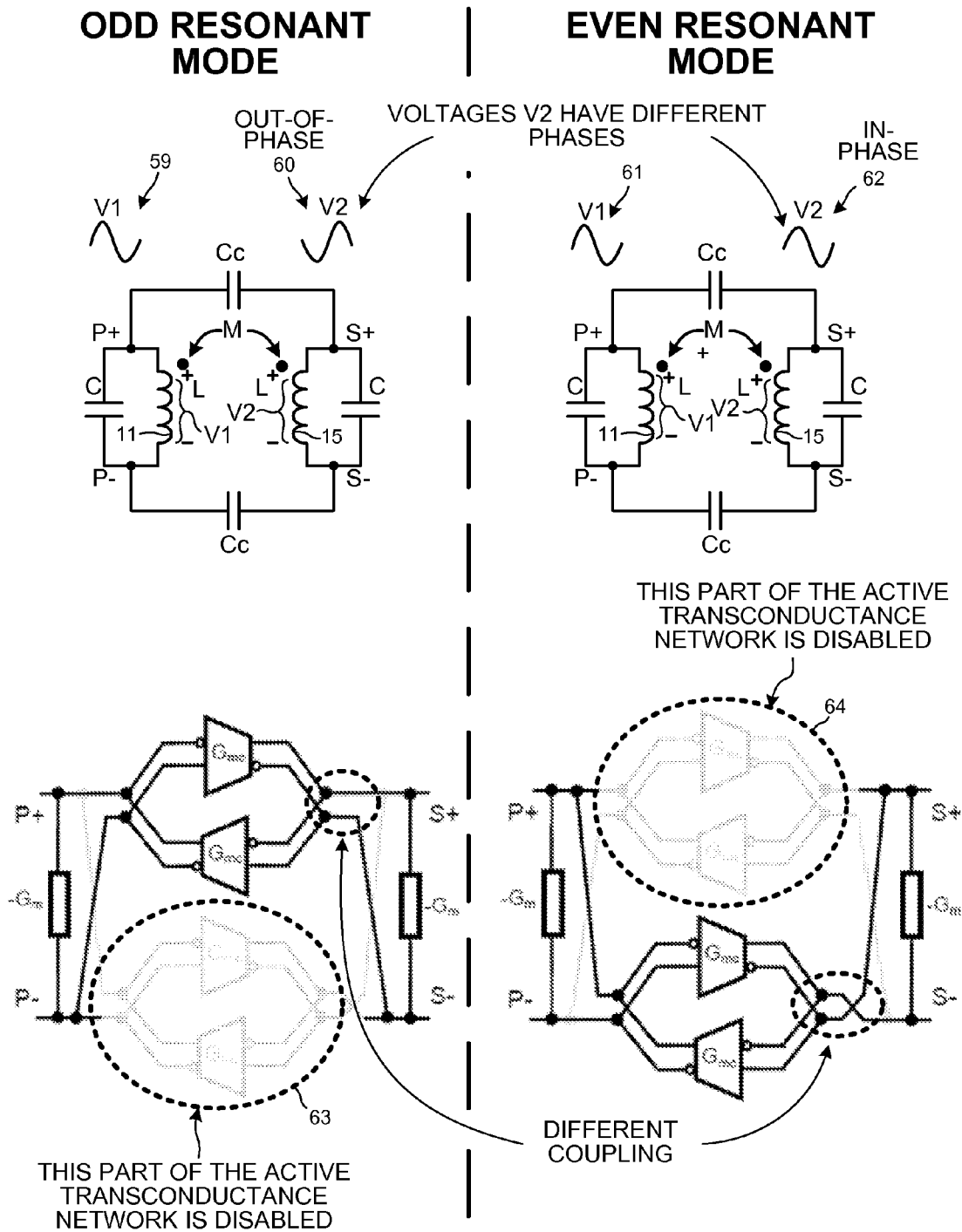
FIG. 10 is a diagram that shows how the voltages across the inductors of the two LC tanks of the resonator portion 9 differ in the two resonant modes.

FIG. 10 is a diagram that shows how the voltages across the inductors in the two LC tanks of the resonator portion 9 differ in the two resonant modes. The diagrams in the upper left and upper right of FIG. 10 are of the transformer-based resonator portion 9 of the VCO, whereas the diagrams in the lower left and lower right of FIG. 10 are of the active transconductance network portion 10 of the VCO. In the circuit diagram of the resonator in the upper left of FIG. 10, the oscillating voltage across inductor 11 of the first tank is denoted V1, whereas the oscillating voltage across inductor 15 of the second tank is denoted V2. As the resonator oscillates in its odd resonant mode, these two voltages V1 and V2 are said to be out-of-phase with respect to one another. This out-of-phase relationship is illustrated by the sinusoidal waveforms 59 and 60. Waveform 59 represents the wave shape of voltage V1. Waveform 60 represents the wave shape of voltage V2. This is odd resonant mode circuit operation. For even resonant mode circuit operation, see the right side of FIG. 10. In the circuit diagram of the resonator in the upper right of FIG. 10, the waveforms 61 and 62 are the same. As the resonator oscillates in its even resonant mode, the two voltages V1 and V2 are said to be in-phase with respect to one another. The active transconductance network portion 10 causes the resonator portion 9 to resonate in a selectable one of these two modes by facilitating proper current flow for the selected resonant mode and by damping and suppressing proper current flow for the unselected resonant mode.

The circuit diagram at the bottom left of FIG. 10 shows how the active transconductance network portion 10 facilitates odd resonant mode oscillation. A part 64 of the active transconductance network portion 10 that facilitates out-of-phase current flow is enabled, and a part 63 of the active transconductance network portion 10 that facilitates in-phase current flow is disabled. The circuit diagram at the bottom right of FIG. 10 shows how the active transconductance network portion 10 facilitates even resonant mode oscillation. The part 63 of the active transconductance network portion 10 that facilitates in-phase current flow is enabled, and the part 64 of the active transconductance network portion 10 that facilitates out-of-phase current flow is disabled. The two parts 63 and 64 are similar circuits, except for the way that they are connected to the second port S+/S−. One way facilitates out-of-phase current flow, whereas the other facilitates in-phase current flow.

Figure 11:
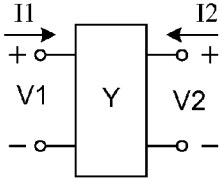
FIG. 11 is a table that shows how the active transconductance network portion 10 can be modeled as a two-port network.

FIG. 11 is a table that shows how the active transconductance network portion 10 can be modeled as a two-port network. Upper left block 65 of the table shows the two-port network including its defined voltages and currents and admittance Y-matrix. The next block down in the diagram, block 66, shows the I=YV two-port matrix equation. The next block down in the diagram, block 67, shows that for even resonant mode operation V2=V1 whereas the next block down in the diagram, block 68, shows that for odd resonant mode operation V2=−V1. The upper block 69 in the center column of the diagram shows the part of the active transconductance network portion 10 that is enabled in even resonant mode operation. The next block down in the diagram, block 70, shows the admittance Y-matrix for the active transconductance network portion when it is configured for even resonant mode operation. The next block down in the diagram, block 71, shows that there is more power injection facilitating even mode oscillation than there is facilitating odd mode oscillation as indicated by the lowest block 72 in the middle column. The upper block 73 in the right column of the diagram shows the part of the active transconductance network portion 10 that is enabled in odd resonant mode operation. The next block down in the diagram, block 74, shows the admittance Y-matrix for the active transconductance network portion when it is configured for odd resonant mode operation. The bottom block 75 shows that there is more power injection facilitating odd mode oscillation than there is facilitating even mode oscillation as indicated by block 76.

Figures 12, 13, 15:
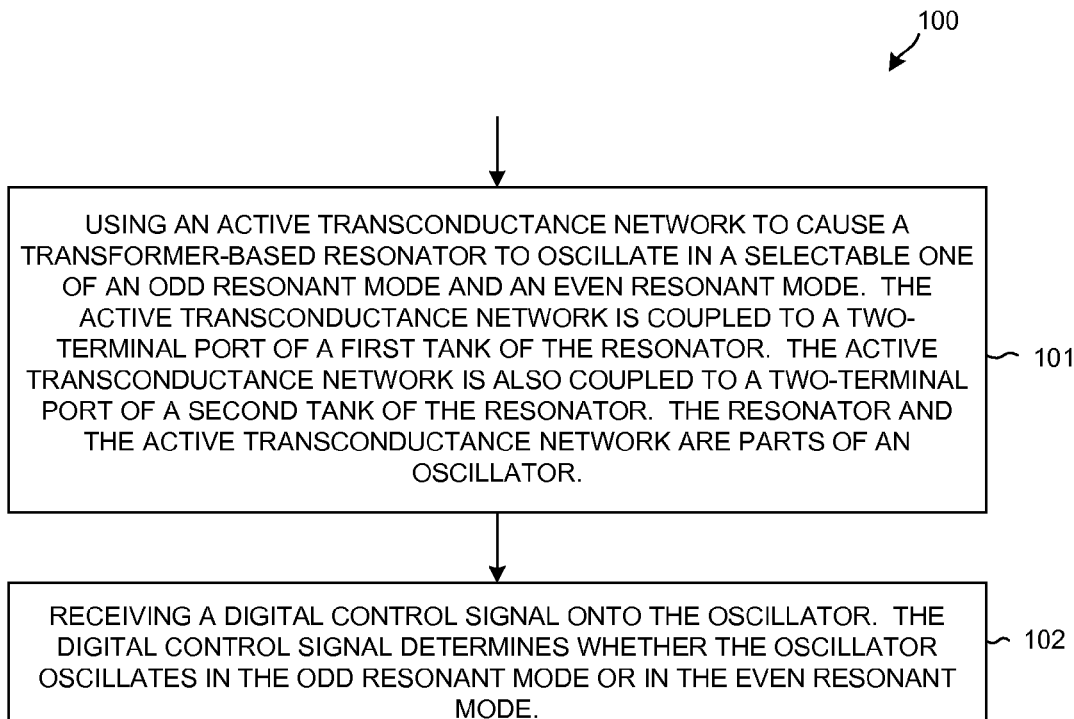
FIG. 12 is a diagram that sets forth conditions required for even mode oscillation.
FIG. 13 is a diagram that sets forth conditions required for odd mode oscillation.
FIG. 15 is a simplified flowchart of a method 100 in accordance with one novel aspect.

FIG. 12 is a diagram that sets forth the conditions required for even mode oscillation. The components of the active transconductance network portion 10 are selected such that these conditions are met when the digital control signal EVEN/ODDB is a digital logic high (even mode oscillation is selected). The relationships of the first row 77 are for even mode start up. The relationships of the second row 78 are to damp odd mode oscillation. Both conditions need to be satisfied for proper functionality.

FIG. 13 is a diagram that sets forth the conditions required for odd mode oscillation. The components of the active transconductance network portion 10 are selected such that these conditions are met when the digital control signal EVEN/ODDB is a digital logic low (odd mode oscillation is selected). The relationships of the first row 79 are for odd mode start up. The relationships of the second row 80 are to dampen even mode oscillation. Both conditions are met to provide proper functioning.

FIG. 14 is a table that sets forth circuit parameters and characteristics for one implementation that satisfies the conditions of FIG. 12 and FIG. 13. Operation at any oscillating frequency in a first part (lower frequency part) of the wide tuning range is accomplished by configuring the VCO to oscillate in the odd resonant mode and by then adjusting the capacitance C using the analog signal VIN and the eight-bit digital signal COARSE_TUNE. Operation at any oscillating frequency in a second part (high frequency part) of the wide tuning range is accomplished by configuring the VCO to oscillate in the even resonant mode and by then adjusting the capacitance C using the analog signal VIN and the eight-bit digital signal COARSE_TUNE.

FIG. 15 is a flowchart of a method 100 in accordance with one novel aspect. An active transconductance network is used (step 101) to cause a transformer-based resonator to oscillate in a selectable one of an odd resonant mode and an even resonant mode. The active transconductance network is coupled to a two-terminal port of a first LC tank of the resonator. The active transconductance network is also coupled to a two-terminal port of a second LC tank of the resonator. The resonator and the active transconductance network are parts of a VCO. In one specific example, the active transconductance network is network 10 of FIG. 6 and FIG. 7. A digital control signal received (step 102) onto the oscillator determines whether the VCO oscillates in the even resonant mode or in the odd resonant mode.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

In one specific example, digital control information that is or determines the EVEN_ODDB and COARSE_TUNE values is determined by a digital processor of a digital baseband processor integrated circuit. The determined digital control information is stored for a time in semiconductor memory (a processor-readable medium) in the digital baseband processor integrated circuit. The instructions executed by the processor of the digital baseband processor integrated circuit that cause the digital control information to be generated are a program of processor-executable instructions stored in the semiconductor memory. The digital control information so determined is then communicated across a serial bus to an RF transceiver integrated circuit that includes the VCO. The VCO is a part of a local oscillator on the RF transceiver integrated circuit. The digital control information passes into the RF transceiver integrated circuit and is stored in registers, such that the registers supply the EVEN/ODDB and COARSE_TUNE signals to the VCO. Accordingly, digital control information that determines the EVEN/ODDB signal value is transmitted from the digital baseband processor integrated circuit and is received by the RF transceiver integrated circuit.

Although certain specific embodiments are described above for instructional purposes, the teachings of this patent document have general applicability and are not limited to the specific embodiments described above. An active transconductance network portion implemented in complementary logic circuitry (for example, CMOS) can be used in combination with a transformer-based LC resonator whose inductors do not have center taps. An active transconductance network portion implemented with P-channel transistors can be used in combination with a transformer-based LC resonator whose center taps are grounded. Rather than the capacitors 12 and 16 involving parallel connected capacitors, the capacitors 12 and 16 can involve networks of capacitors and switches where some capacitors are coupled in series. Although the specific embodiment of the transformer-based resonator set forth above involves inductors 11 and 15 of the two tanks being of the same inductance, and involves capacitors 12 and 16 of the two tanks being of the same capacitance, in other embodiments the inductors of the two tanks can be of different values and/or the capacitors of the two tanks can be of different capacitances. The product of the inductance of inductor 11 and the capacitance of capacitor 12 can be different from the product of the inductance of inductor 15 and the capacitance of capacitor 16. The active transconductance network 10 can be symmetric as in the specific embodiment described above, or the active transconductance network 10 can be asymmetric. In one asymmetric example, the two −Gmc cells 40 and 41 have different transconductances. One or more of the four Gmc circuits 43-46 can have a different transconductance that is different from the transconductance (s) of one or more of the other of the four Gmc circuits 43-46. Accordingly, various modifications, adaptations, and combinations of the various features of the described specific embodiments can be practiced without departing from the scope of the claims that are set forth below.

What is claimed is:

1. An oscillator comprising:
   a transformer-based LC resonator that has an odd resonant mode and an even resonant mode, wherein the transformer-based LC resonator comprises a first inductor, a second inductor, a first capacitor, a second capacitor, a third capacitor, and a fourth capacitor, wherein the first inductor and the first capacitor are coupled in parallel between a first node and a second node, wherein the second inductor and the second capacitor are coupled in parallel between a third node and a fourth node, wherein the third capacitor is coupled between the first node and the third node, wherein the fourth capacitor is coupled between the second node and the fourth node, and wherein the first and second inductors have a mutual inductance M and form a transformer;
   a control signal input conductor; and
   an active transconductance network coupled to the first, second, third and fourth nodes of the transformer-based LC resonator, wherein when a control signal on the control signal input conductor has a first digital logic value then the active transconductance network causes the transformer-based LC resonator to resonate in its odd resonant mode, and wherein when the control signal on the control signal input conductor has a second digital logic value then the active transconductance network causes the transformer-based LC resonator to resonate in its even resonant mode.

2. The oscillator of claim 1, wherein the third capacitor has a capacitance that is at least five percent of a capacitance of the first capacitor, and wherein the fourth capacitor has a capacitance that is at least five percent of the capacitance of the first capacitor.

3. The oscillator of claim 1, wherein the active transconductance network comprises:
   a first transconductance network coupled to the first and second nodes, wherein the first transconductance network acts as a negative resistance circuit coupled between the first and second nodes;
   a second transconductance network coupled to the third and fourth nodes, wherein the second transconductance network acts as a negative resistance circuit coupled between the third and fourth nodes; and
   a third transconductance network coupled to the first, second, third and fourth nodes, wherein the third transconductance network is an active circuit that injects energy into the oscillator for odd resonant mode oscillation and absorbs energy for even resonant mode oscillation when the control signal has the first digital logic value, and that injects energy into the oscillator for even resonant mode oscillation and absorbs energy for odd resonant mode oscillation when the control signal has the second digital logic value.

4. The oscillator of claim 3, wherein the third transconductance network comprises:
   a first Gmc circuit having a first input lead, a second input lead, a first output lead, and a second output lead, wherein the first input lead of the first Gmc circuit is coupled to the first node, wherein the second input lead of the first Gmc circuit is coupled to the second node, wherein the first output lead of the first Gmc circuit is coupled to the third node, and wherein the second output lead of the first Gmc circuit is coupled to the fourth node;
   a second Gmc circuit having a first input lead, a second input lead, a first output lead, and a second output lead, wherein the first input lead of the second Gmc circuit is coupled to the third node, wherein the second input lead of the second Gmc circuit is coupled to the fourth node, wherein the first output lead of the second Gmc circuit is coupled to the first node, and wherein the second output lead of the second Gmc circuit is coupled to the second node;
   a third Gmc circuit having a first input lead, a second input lead, a first output lead, and a second output lead, wherein the first input lead of the third Gmc circuit is coupled to the first node, wherein the second input lead of the third Gmc circuit is coupled to the second node, wherein the first output lead of the third Gmc circuit is coupled to the fourth node, and wherein the second output lead of the third Gmc circuit is coupled to the third node; and
   a fourth Gmc circuit having a first input lead, a second input lead, a first output lead, and a second output lead, wherein the first input lead of the fourth Gmc circuit is coupled to the fourth node, wherein the second input lead of the fourth Gmc circuit is coupled to the third node, wherein the first output lead of the fourth Gmc circuit is coupled to the first node, and wherein the second output lead of the fourth Gmc circuit is coupled to the second node,
   wherein the first and second Gmc circuits are disabled when the oscillator oscillates in the even resonant mode, and wherein the third and fourth Gmc circuits are disabled when the oscillator oscillates in the odd resonant mode.

5. The oscillator of claim 4, wherein at least one of the first, second, third and fourth Gmc circuits has a transconductance that is substantially different from a transconductance of at least one other of the first, second, third and fourth Gmc circuits.

6. The oscillator of claim 3, wherein the first and second transconductance networks have substantially different transconductances.

7. The oscillator of claim 1, wherein the first capacitor is a variable capacitor element and comprises:
   a first varactor coupled between the first node and a first VIN input signal node; and a second varactor coupled between the second node and the first VIN input signal node.

8. The oscillator of claim 7, wherein the first capacitor further comprises:
a digitally-programmable capacitor coupled between the first node and the second node.

9. The oscillator of claim 1, wherein the first and second inductors have substantially the same inductance, and wherein the first and second capacitors have substantially the same capacitance.

10. The oscillator of claim 1, wherein the first inductor and the first capacitor form a first resonant tank that has a first natural oscillating frequency, wherein the second inductor and the second capacitor form a second resonant tank that has a second natural oscillating frequency, and wherein the first and second natural oscillating frequencies are substantially identical when the oscillator operates both in the even resonant mode and in the odd resonant mode.

11. The oscillator of claim 1, wherein the first and second inductors have substantially different inductances.

12. The oscillator of claim 1, wherein the first and second capacitors have substantially different capacitances.

13. The oscillator of claim 1, wherein the third and fourth capacitors have capacitances of at least 0.2 picofarads, wherein the third and fourth capacitors are taken from the group consisting of: MOS capacitors, and MIM (Metal-Insulator-Metal) capacitors, wherein the mutual inductance M is given by the relation k=M/sqrt(L1L2), where L1 is the inductance of the first inductor, where L2 is the inductance of the second inductor, and where |k|>0.02.

14. The oscillator of claim 1, wherein the active transconductance network comprises:
a first transistor having a gate coupled to the first node and having a drain coupled to the third node; and
a second transistor having a gate coupled to the second node and having a drain coupled to the fourth node, wherein a source of the first transistor is coupled to a source of the second transistor.

15. The oscillator of claim 14, wherein the active transconductance network further comprises:
a third transistor having a drain coupled to the source of the first transistor and to the source of the second transistor, and wherein a gate of the third transistor is coupled to receive a digital control signal.

16. The oscillator of claim 1, wherein the active transconductance network comprises:
a first transistor having a gate coupled to the first node and having a drain coupled to the fourth node; and
a second transistor having a gate coupled to the second node and having a drain coupled to the third node, wherein a source of the first transistor is coupled to a source of the second transistor.

17. The oscillator of claim 16, wherein the active transconductance network further comprises:
a third transistor having a drain coupled to the source of the first transistor and to the source of the second transistor, and wherein a gate of the third transistor is coupled to receive a digital control signal.

18. The oscillator of claim 1, wherein in the even resonant mode current flow through the first inductor has a first phase relationship with respect to current flow through the second inductor, and wherein in the odd resonant mode current flow through the first inductor has a second phase relationship with respect to current flow through the second inductor.

19. A method comprising:
using an active transconductance network to cause a transformer-based resonator to oscillate in a selectable one of an odd resonant mode and an even resonant mode, wherein the active transconductance network is coupled to two two-terminal ports of the resonator, wherein a first of the two two-terminal ports is a port of a first tank of the resonator, wherein a second of the two two-terminal ports is a port of a second tank of the resonator, wherein the resonator and the active transconductance network are parts of an oscillator; and
receiving a digital control signal onto the oscillator, wherein the digital control signal determines whether the oscillator oscillates in the odd resonant mode or in the even resonant mode, wherein the first tank includes a first inductor that is coupled in parallel with a first capacitor, wherein the second tank includes a second inductor that is coupled in parallel with a second capacitor, wherein a third capacitor couples a first node of the first tank to a first node of the second tank, and wherein a fourth capacitor couples a second node of the first tank to a second node of the second tank.

20. The method of claim 19, wherein the first inductor and the second inductor have substantially the same inductance, and wherein the first capacitor and the second capacitor have substantially the same capacitance.

21. The method of claim 19, wherein the active transconductance network comprises:
a first transconductance network coupled to the first node of the first tank and to the second node of the first tank, wherein the first transconductance network acts as a negative resistance circuit; and
a second transconductance network coupled to the first node of the second tank and to the second node of the second tank, wherein the second transconductance network acts as a negative resistance circuit.

22. An apparatus comprising:
a transformer-based resonator that has an odd resonant mode and an even resonant mode, wherein the resonator comprises a first inductor, a second inductor, a first capacitor and a second capacitor, wherein the first inductor and the first capacitor are coupled in parallel between a first node and a second node, wherein the second inductor and the second capacitor are coupled in parallel between a third node and a fourth node, wherein the resonator further comprises a third capacitor coupled between the first node and the third node, and wherein the resonator further comprises a fourth capacitor coupled between the second node and the fourth node; and
means coupled to the first, second, third and fourth nodes of the resonator for injecting energy into the resonator such that the transformer-based resonator resonates in its odd resonant mode when a digital control signal has a first digital value and for injecting energy into the resonator such that the resonator resonates in its even resonant mode when the digital control signal has a second digital value.

23. The apparatus of claim 22, wherein the means for injecting energy comprises:
first means coupled to the first and second nodes for acting as a negative resistance between the first and second nodes;
second means coupled to the third and fourth nodes for acting as a negative resistance between the second and fourth nodes;
a digital control input conductor; and
third means coupled to the first, second, third and fourth nodes and to the digital control input conductor, wherein the third means is for injecting energy for odd resonant mode oscillation and for absorbing energy for even resonant mode oscillation when the digital control signal has the first digital logic value, and wherein the third means is for injecting energy for even resonant mode oscillation and for absorbing energy for odd resonant mode oscillation when the digital control signal has the second digital logic value.

24. The apparatus of claim 23, wherein the first means is not directly connected to either the third node or the fourth node, and wherein the second means is not directly connected to either the first node or the second node.

25. The apparatus of claim 24, wherein the third means includes a first portion and a second portion, wherein the first portion is enabled when the digital control signal on the digital control input conductor has a first digital logic value and is disabled when the digital control signal on the digital control input conductor has a second digital logic value, and wherein the second portion is disabled when the digital control signal on the digital control input conductor has a first digital logic value and is enabled when the digital control signal on the digital control input conductor has a second digital logic value.

26. An oscillator comprising:
a transformer-based LC resonator that has an odd resonant mode and an even resonant mode, wherein the transformer-based LC resonator comprises a first inductor, a second inductor, a first capacitor and a second capacitor, wherein the first inductor and the first capacitor are coupled in parallel between a first node and a second node, wherein the second inductor and the second capacitor are coupled in parallel between a third node and a fourth node, wherein the first inductor has a center tap that is coupled to a supply voltage conductor, wherein the second inductor has a center tap that is coupled to the supply voltage conductor, and wherein the first and second inductors have a mutual inductance M and form a transformer;
a control signal input conductor; and
an active transconductance network coupled to the first, second, third and fourth nodes of the transformer-based LC resonator, wherein when a control signal on the control signal input conductor has a first digital logic value then the active transconductance network causes the transformer-based LC resonator to resonate in its odd resonant mode, and wherein when the control signal on the control signal input conductor has a second digital logic value then the active transconductance network causes the transformer-based LC resonator to resonate in its even resonant mode.

27. The oscillator of claim 26, wherein the first inductor and second inductor have substantially the same inductance, and wherein the first capacitor and second capacitor have substantially the same capacitance.

28. The oscillator of claim 26, wherein the active transconductance network comprises:
a first transconductance network coupled to the first node and to the second node, wherein the first transconductance network acts as a negative resistance circuit; and
a second transconductance network coupled to the third and fourth nodes, wherein the second transconductance network acts as a negative resistance circuit.

* * * * *